United States Patent [19]

Holonyak, Jr. et al.

[11] Patent Number: 5,936,266
[45] Date of Patent: Aug. 10, 1999

[54] SEMICONDUCTOR DEVICES AND METHODS WITH TUNNEL CONTACT HOLE SOURCES

[75] Inventors: Nick Holonyak, Jr., Urbana; Jonathan J. Wierer, Champaign; Peter W. Evans, Urbana, all of Ill.

[73] Assignee: The Board of Trustees of The University of Illinois

[21] Appl. No.: 08/950,653

[22] Filed: Oct. 15, 1997

Related U.S. Application Data

[60] Provisional application No. 60/053,338, Jul. 22, 1997.

[51] Int. Cl.[6] .......................... H01L 33/00; H01L 29/88; H01S 3/19
[52] U.S. Cl. .............................. 257/106; 257/97; 257/96; 372/43; 372/45
[58] Field of Search ............................... 257/96, 97, 106; 372/43, 45

[56] References Cited

U.S. PATENT DOCUMENTS

| | | | |
|---|---|---|---|
| 5,166,761 | 11/1992 | Olson | 257/97 |
| 5,550,081 | 8/1996 | Holonyak, Jr. et al. | 437/129 |
| 5,568,499 | 10/1996 | Lear | 257/97 |
| 5,610,412 | 3/1997 | Awano | 257/97 |
| 5,696,389 | 12/1997 | Ishikawa | 372/50 |

OTHER PUBLICATIONS

N. Holonyak, Jr. and I.A. Lesk, Gallium Arsenide Tunnel Diodes, Proc. IRE 48, pp. 1405–1409, 1960.

T.A. Richard, E.I. Chen, A.R. Sugg. G.E. Hofler, and N. Holonyak, Jr., High Current Density Carbon–Doped Strained–Layer GaAs (p+)–InGaAs (n+)–GaAs (n+) p–n Tunnel Diodes, Appl. Phys. Lett. 63, pp. 3613–3615, 1993).

A.R. Sugg, E.I. Chen, T.A. Richard, S.A. Maranowski, and N. Holonyak, Jr., n–p(p+–n+)–n $Al_yGa_{1-y}As$–GaAs–$In_xGa_{1-x}As$ Quantum–Well Laser With p+–n+ GaAs–InGaAs Tunnel Contact On n–GaAs, Appl. Phys. Lett. 62, pp. 2510–2512 (1993).

M. Dallesasse, N. Holonyak Jr., A.R. Sugg, T.A. Richard, and N. El Zein, Hydrolyzation Oxidation Of $Al_xGa_{1-x}As$–AlAs–GaAs Quantum Well Heterostructures And Superlattices, Appl. Phys. Lett 57 pp. 2844–2846, 1990.

A.R. Sugg, E.I. Chen, T.A. Richard, N. Holonyak, Jr., and K.C. Hsieh, Native Oxide–Embedded $Al_yGa_{1-y}As$–GaAs–$In_xGa_{1-x}As$ Quantum Well Heterostructure Lasers, Appl. Phys. Lett. 62, pp. 1259–1261, 1993.

P.W. Evans, N. Holonyak, Jr., S.A. Maranowski, M.J. Ries, and E.I. Chen, Edge–Emitting Quantum Well Heterostructure Laser Diodes With Auxuliary Native–Oxide Vertical Cavity Confinement, Appl. Phys. Lett. 67, pp. 3168–3170, 1995.

(List continued on next page.)

*Primary Examiner*—Jerome Jackson, Jr.
*Attorney, Agent, or Firm*—Martin Novack

[57] ABSTRACT

Semiconductor devices and methods are disclosed in which the amount of p-type material can be minimized, with attendant advantages in electrical, thermal, and optical performance, and in fabrication. A form of the disclosure is directed to a generally planar semiconductor device wherein a layer of p-type semiconductor material is disposed over a layer of n-type semiconductor material, and an electric potential is coupled between the p-type layer and the n-type layer, and wherein current in the device that is lateral to the plane of the layers is coupled into the p-type layer. A tunnel junction is adjacent the p-type layer for converting the lateral current into hole current. In an embodiment of this form of the disclosure, the tunnel junction is an n+/p+ junction oriented with the p+ portion thereof adjacent the p-type layer. The lateral current can be electron current in the n+ layer and/or electron current in a further layer of n-type material disposed over the tunnel junction.

27 Claims, 11 Drawing Sheets

OTHER PUBLICATIONS

H. Deng. Q. Deng, and D.G. Deppe, Native–Oxide Laterally Confined Whispering–Gallery Mode Laser With Vertical Emission, Appl. Phys. Lett. 69, pp. 3120–3122, 1996.

M. Wolf, Limitations And Possibilities For Improvement Of Photovoltaic Solar Energy Converters, Proceeding of the IRE, pp. 1246–1262, Jul., 1960.

M.F. Lamorte, and D.H. Abbott, Cascade Solar–Cell Design For High–Temperature Operation, IEEE Transactions On Electron Devices, vol. ED–27, No. 4, pp. 831–841, Apr., 1980.

S.M. Bedhair, S.B. Phatak, and J.R. Hauser, Material And Device Considerations For Cascade Solar Cells, IEEE Transactions On Electron Devices, vol. Ed–27, No. 4, pp. 822–831, Apr., 1980.

S.M. Bedair, M.F. Lamorte and J.R. Hauser, A Two–Junction Cascade Solar–Cell Structure, Appl. Phys. Lett 34(1) pp. 38–39, Jan. 1, 1979.

D.L. Huffker, D.G. Deppe, and K. Kumar, Native–Oxide Defined Ring Contact For Low Threshold Vertical–Cavity Lasers, Appl. Phys. Lett. 65, pp. 97–99, 1994.

S.A. Maranowski, A.R. Sugg, E.I. Chen, and N. Holonyak, Jr., Native Oxide Top–And Bottom–Confined Narrow Stripe p–n $Al_yGa_{1-y}As$–GaAs–$In_xGa_{1-x}As$ Quantum Well Heterostructure Laser, Appl. Phys. Lett. 63, pp. 1660–1662, 1993.

5,936,266

SEMICONDUCTOR DEVICES AND METHODS WITH TUNNEL CONTACT HOLE SOURCES

RELATED APPLICATION

This application claims priority from U.S. Provisional patent application Ser. No. 60/053,338, filed Jul. 22, 1997, and said Provisional Patent Application is incorporated herein by reference.

This invention was made with Government support under Contract DAAH04-96-1-033 of Army Research Office, under Contract MDA972-94-1-004 of DARPA Center of Optoelectronics Science and Technology, and under Grant SBCUTC-97-0080 of National Science Foundation. The Government has certain rights in this invention.

BACKGROUND OF THE INVENTION

This invention relates to semiconductor devices and methods. The invention has particularly advantageous application to III-V semiconductor light emitting devices, including semiconductor lasers and semiconductor light emitting diodes (LEDs).

In many semiconductor devices, there is a substantial volume of both n-type semiconductor material (that is, semiconductor doped with donor impurities so that electrons are majority carriers) and p-type semiconductor material (that is, semiconductor doped with acceptor impurities so that holes [shortage of valence electrons] are majority carriers). In III-V semiconductor light emitting devices (e.g. lasers or LEDs), an active region can be disposed between n-type and p-type semiconductor regions. Upon application of an electrical potential, holes entering the active region from the p-type semiconductor material recombine with electrons entering the active region from the n-type semiconductor material, and photons are emitted.

In several respects, p-type material is more difficult to work with than n-type material, and tends to be operationally inferior to corresponding n-type material with regard to carrier mobility and overall electrical efficiency. Accordingly, it is often desirable to favor the use of n-type semiconductor material in the fabrication of semiconductor devices such as III-V light emitting devices. However, even though the substrate and a fractional majority of the semiconductor volume in such devices may be n-type semiconductor or undoped semiconductor, a substantial amount of p-type material is generally considered necessary as a source of hole current in various semiconductor devices. As described further hereinbelow, the disadvantages of employing p-type material in certain devices is even more pronounced when currents must travel laterally through p-type layers in planar devices.

It is among the objects of the present invention to improve semiconductor devices and methods by reducing the amount of p-type material that is needed in certain applications.

SUMMARY OF THE INVENTION

The present invention is directed to semiconductor devices and methods in which the amount of p-type material can be minimized, with attendant advantages in electrical, thermal, and optical performance, and in fabrication.

A form of the invention is directed to a generally planar semiconductor device wherein a layer of p-type semiconductor material is disposed over (that is, directly on or with one or more intervening layers) a layer of n-type semiconductor material, and an electric potential is coupled between the p-type layer and the n-type layer, and wherein current in the device that is lateral to the plane of the layers is coupled into the p-type layer. The improvement in this form of the invention comprises a tunnel junction adjacent the p-type layer for converting the lateral current into hole current. In an embodiment of this form of the invention, the tunnel junction is an n+/p+ junction oriented with the p+ portion thereof adjacent said p-type layer. [The "+" notation conventionally means "heavily doped", and, for purposes hereof, is generally donor impurity concentration of at least about $10^{18}/cm^3$ for n+, and acceptor impurity concentration of at least about $10^{19}/cm^3$ for p+.] The lateral current can be electron current in the n+ layer and/or electron current in a further layer of n-type material disposed over the tunnel junction.

Tunneling in GaAs, at an n+/p+ junction, is well known (see, for example, N. Holonyak, Jr. and I. A. Lesk, Proc. IRE 48, 1405, 1960), and is generally of interest for its negative resistance. Tunneling in GaAs can be enhanced with an InGaAs transition region (see, for example, T. A. Richard, E. I. Chen, A. R. Sugg. G. E. Hofler, and N. Holonyak, Jr., Appl. Phys. Lett. 63, 3613, 1993), and besides its negative resistance behavior, can be used in reverse bias as a form of "ohmic" contact. This allows, for example, the reversal of the doping sequence of an $Al_xGa_{1-x}As$-GaAs quantum well heterostructure laser (n→p to p→n) grown on an n-type GaAs substrate (see, for example, A. R. Sugg, E. I. Chen, T. A. Richard, S. A. Maranowski, and N. Holonyak, Jr., Appl. Phys. Lett. 62, 2510 (1993). A form of the present invention is directed to a semiconductor light emitting device (e.g. a semiconductor laser or a semiconductor light emitting diode) which comprises the following: a semiconductor active region disposed between first and second semiconductor layers, the first semiconductor layer being p-type, and the second semiconductor layer being n-type; tunnel junction means disposed over the first semiconductor layer; and means for coupling electric potential between the tunnel junction means and the second semiconductor layer; and means for causing lateral electron flow into the tunnel junction means.

A tunnel contact junction can be used in a light emitting semiconductor device as a hole source and makes possible lateral bias currents (electron current) to drive a quantum well heterostructure (QWH) laser without the compromise of the low mobility and large resistive voltage drop of lateral conduction in thin p-type layers. This is particularly valuable in QWH laser structures employing upper and/or lower native oxide confining layers (see, for example, M. Dallesasse, N. Holonyak Jr., A. R. Sugg, T. A. Richard, and N. El Zein, Appl. Phys. Lett 57 2844, 1990; A. R. Sugg, E. I. Chen, T. A. Richard, N. Holonyak, Jr., and K. C. Hsieh, Appl. Phys. Lett. 62, 1259, 1993) that require lateral bias currents (see, for example, P. W. Evans, N. Holonyak, Jr., S. A. Maranowski, M. J. Ries, and E. I. Chen, Appl. Phys. Lett. 67, 3168, 1995), or in devices such as a vertical cavity surface emitting laser (VCSEL) where lateral hole currents have been employed (see, for example, D. L. Huffker, D. G. Deppe, and K. Kumar, Appl. Phys. Lett. 65, 97, 1994). Hole conduction along a layer introduces a large device series resistance, because of the low hole mobility in GaAs, and increases threshold voltages and device heating. A tunnel contact junction on the p side of an oxide confined QWH can be used to replace lateral hole excitation currents. The hole injection is supported by a lateral electron current, thus providing lower voltage drop and less series resistance. An objective hereof is to minimize the amount of p-type material and, to the extent possible, employ only n-type layers (electron conduction) to carry the device current. In addition to electrical and thermal performance advantages from reducing the amount of lossier p-type material, optical advantage can also accrue since p-type material of the same conductance as n-type material will generally be more absorptive of the light being generated in semiconductor light emitting devices. Conversely, since the tunnel contact junction is highly doped, it should be kept relatively thin to avoid undue light absorption.

Further features and advantages of the invention will become more readily apparent from the following detailed description when taken in conjunction with the accompanying drawings.

DETAILED DESCRIPTION

Figure 1:
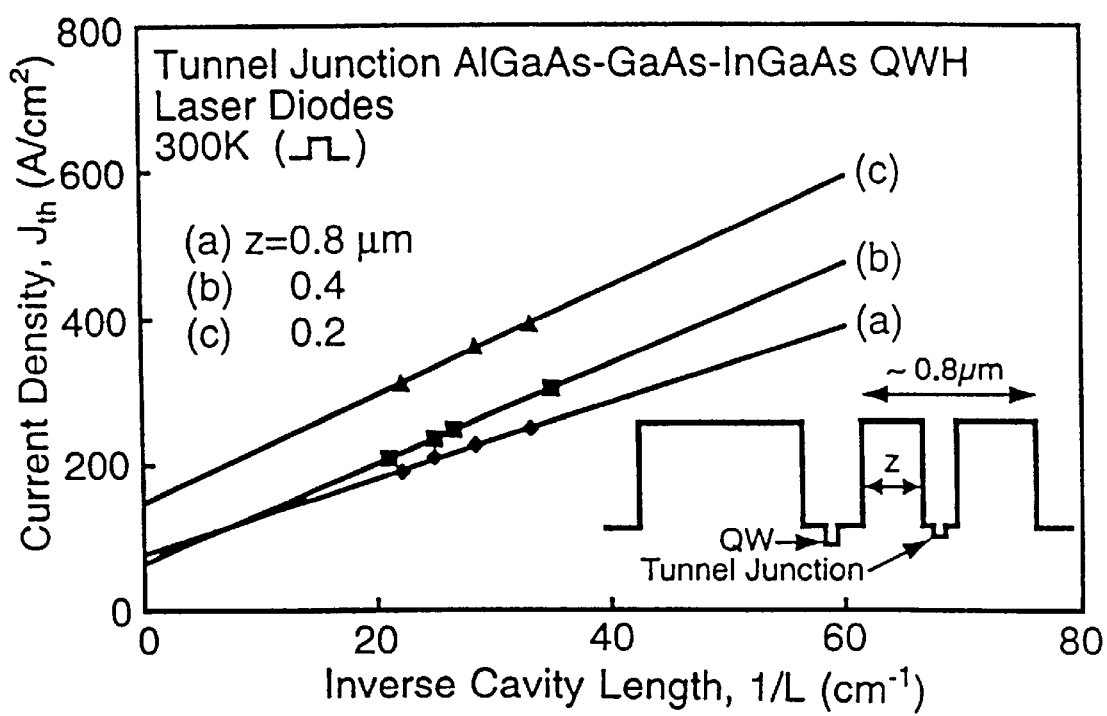
FIG. 1 shows current density at threshold (Jth) vs. inverse cavity length (1/L) for the broad area quantum well heterostructure (QWH) lasers in accordance with an embodiment hereof, with reverse-biased tunnel junction contacts contained in the p-type cladding at different distances, z, from the quantum well (QW) and waveguide active region as shown in the inset of the Figure.

In an early phase of work on the invention, crystals were grown to investigate first the effect of introducing a heavily doped region, a tunnel contact junction, close to the waveguide active region of a standard quantum well heterostructure (QWH) laser. The crystals were grown by metalorganic chemical vapor deposition (MOCVD) on n-type substrates with Si as the n-type dopant and C as the p-type dopant. [For background regarding MOCVD, see, for example, R. D. Dupuis, L. A. Moudy, and P. D. Dapkus, in Proceedings of the International Symposium on GaAs and Related Compounds, edited by C. M. Wolfe, Institute of Physics, London, 1979, pp. 1–9. See also, M. J. Ludowise, J. Appl. Phys. 58, R31, 1985.] First, an n+ GaAs buffer layer and then a 0.8 μm n-type $Al_{0.85}Ga_{0.15}As$ layer were grown. An undoped GaAs waveguide region (2400 Å) with an $In_{1-y}Ga_yAs$ (~980 nm, y~0.2) quantum well (QW) in the center was grown next. Then, 0.8 μm of upper (top) cladding crystal consisting mainly of $Al_{0.85}Ga_{0.15}As$, was grown, with a tunnel junction (TJ) inserted at varying distances from the waveguide (0.2, 0.4, and 0.8 μm, see insert of FIG. 1). The QWH crystal just below the TJ was p-type, and above was n-type. From bottom to top the TJ included ~300 Å of p+ (~$10^{20}$ cm$^{-3}$) GaAs, ~100 Å of n+ (>$10^{19}$ cm$^{-3}$) $In_{0.10}Ga_{0.90}As$, and ~300 Å of n+ (~$10^{19}$ cm$^{-3}$) GaAs. Finally, the crystal was capped with 1500 Å of n+ GaAs. The cladding layers were grown at a temperature of 740° C., the WG at 640° C., and the TJ at 570° C. for the n+ region and 540° C. for the p+ region, all at a V/III ratio ~40.

Broad area lasers were fabricated, first by defining 150 μm stripes in $Si_3N_4$ deposited on the QWH crystal surface and then by evaporating and alloying (375° C., 10 s) Ge/Au/Ni/Au on the epitaxial-layer side and Ge/Au on the substrate side. The crystals were cleaved, diced, and probed under pulsed (2 μs, 1% duty cycle) operation (300 K.). The current densities at threshold ($J_{th}$) vs inverse cavity length (1/L) were measured and shown in FIG. 1. As was expected, if the TJ was brought closer to the WG and QW, the threshold current density increased due to increased absorption losses and asymmetry in the waveguide structure. A TJ as close as 0.2 μm to the waveguide in a standard QWH laser resulted in only a two-fold increase in the threshold current density compared to a TJ contact located as far away as 0.8 μm. The TJ contact caused only a relatively small compromise in current thresholds.

Figure 2:
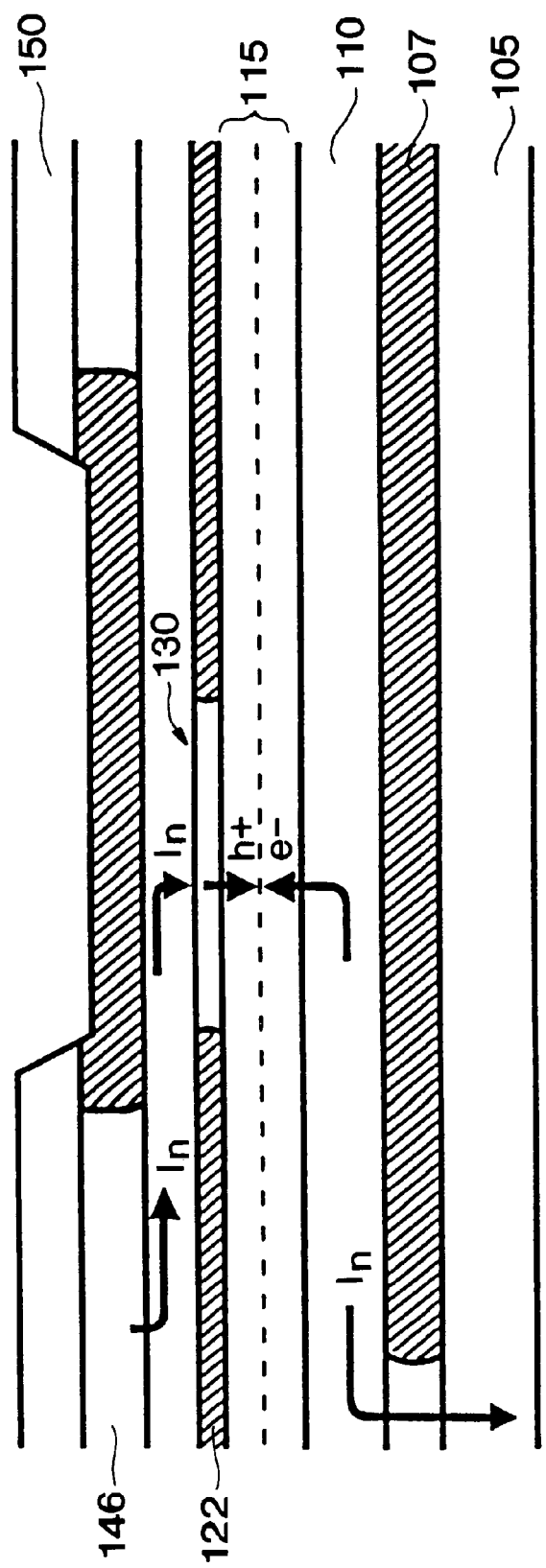
FIGS. 2 and 3 are cross-sectional diagrams (not to scale) of an edge-emitting semiconductor laser device in accordance with an embodiment of the invention and made in accordance with a technique of the invention, with FIG. 3 being a more detailed diagram and FIG. 2 being simplified to facilitate understanding of operation.
Figure 3:
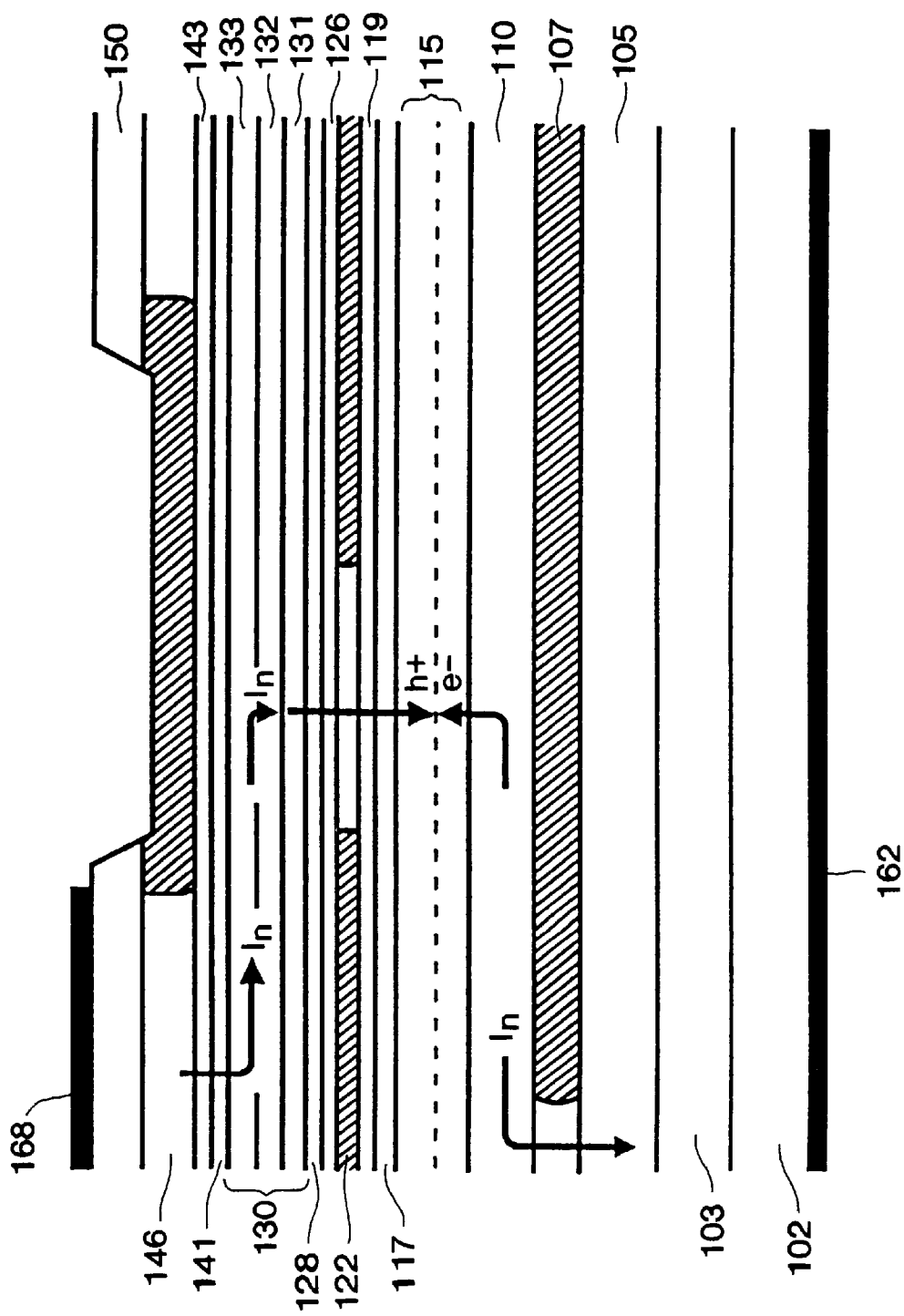

Other crystals were grown that could be processed to give buried-oxide apertures and oxide claddings. Reference can be made to FIGS. 2 and 3, with FIG. 3 showing the greater detail and FIG. 2 being simplified to facilitate illustration of operation. The substrate layer and buffer layer (102 and 103, respectively, in FIG. 3) can be the n-type GaAs layers as described above. The n-type bottom confining layers included 3000 Å of $Al_{0.6}Ga_{0.4}As$ (layer 105), 1500 Å of $Al_{0.98}Ga_{0.02}As$ (layer 107—for the bottom oxide cladding layer), and 2000 Å of $Al_{0.6}Ga_{0.4}As$ (layer 110). The undoped waveguide (WG) region (115) was grown with an $In_yGa_{1-y}As$ QW (~980 nm, y ~0.2) sandwiched between 1200 Å of GaAs on either side. The p-type layer for later conversion into a buried oxide aperture was grown over the active region and consisted of ~600 Å of $Al_{0.95}Ga_{0.05}As$ (layer 122—for subsequent conversion) with ~100 Å of $Al_{0.6}Ga_{0.4}As$ (layers 119 and 126) and $Al_{0.3}Ga_{0.7}As$ (layers 117 and 128) on each side. The TJ for hole injection was grown next and included ~100 Å of p+ GaAs (layer 131), ~100 Å of n+ $In_{0.10}Ga_{0.90}As$ (layer 132), and ~100 Å of n+ GaAs (layer 133). The n-type upper (top) confining layers followed and included ~300 Å of $Al_{0.3}Ga_{0.7}As$ (layer 141), ~300 Å of $Al_{0.6}Ga_{0.4}As$ (layer 143), and 2000 Å of $Al_{0.85}Ga_{0.15}As$ (layer 146—for the top oxide cladding). The crystal was capped with 1500 Å of n+ GaAs (layer 150).

For the oxide-defined QWH lasers of FIGS. 2 and 3, laser fabrication again begins with the deposition of $Si_3N_4$ that is then patterned into two ~4 μm wide stripes ~11 μm apart (center-to-center). With the aid of photolighography and wet etching ($H_2SO_4:H_2O_2:H_2O$, 1:8:80) the different layers to be laterally oxidized are exposed on the outside edges and between the $Si_3N_4$ stripes. One outside edge is etched just past the aperture depth, while the other is etched past the bottom oxide cladding layer. Between the stripes only the 1500 Å GaAs cap is removed (etched), exposing the top $Al_{0.85}Ga_{0.15}As$ for oxidation. The crystal is then oxidized (430° C., 35 min.) in an open tube furnace supplied with $H_2O$ vapor in a $N_2$ carrier gas. [See, for example, M. Dallesasse, N. Holonyak Jr., A. R. Sugg, T. A. Richard, and N. El-Zein, Appl. Phys. Lett. 57, 2844 (1990).]

Figure 4:
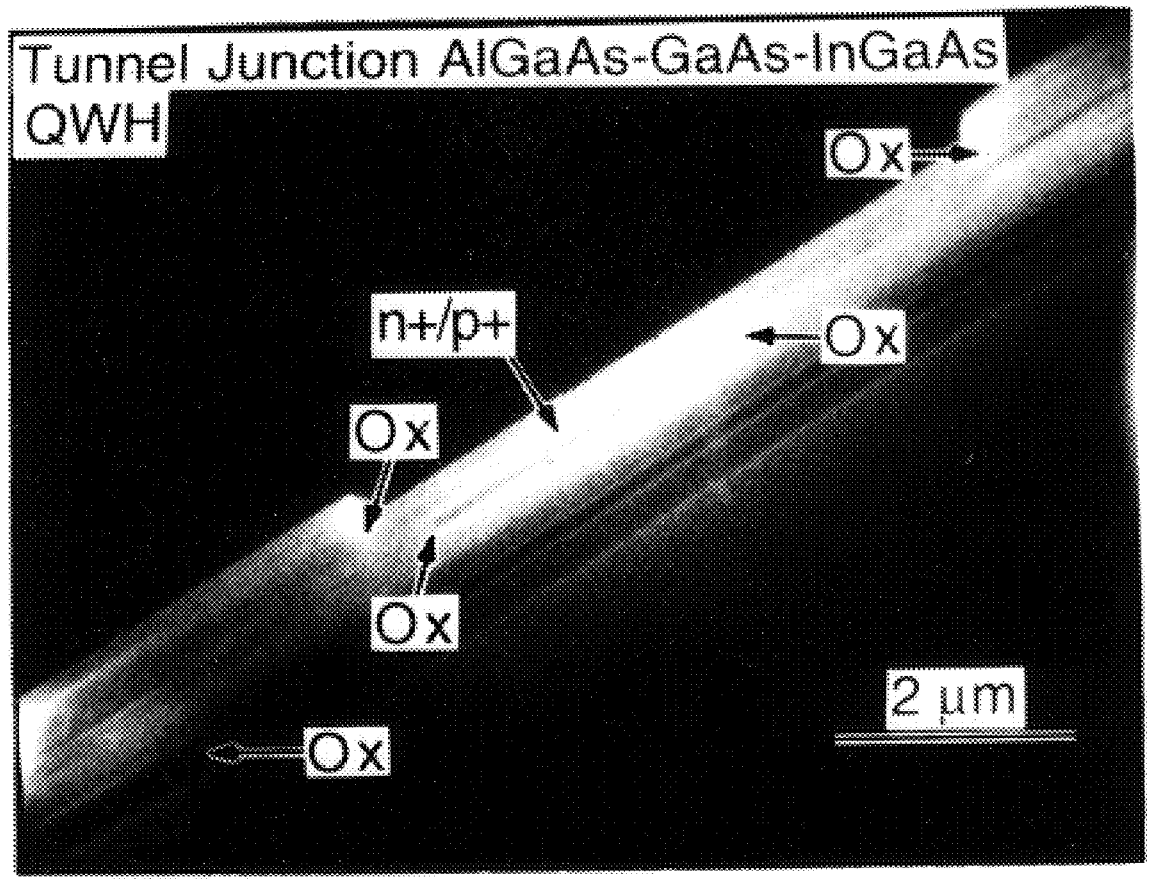
FIG. 4 is a scanning electron microscope image (cross section) of the tunnel contact QWH laser of the diagram of FIGS. 2 and 3. Lateral oxidation (middle "Ox" layer) defines a ~3.5 μm current aperture and, with the top and bottom oxide layers, forces lateral electron current flow, $I_n$, as shown in FIGS. 2 and 3. The "Ox" marker arrows are slanted to point along the layers in the direction of oxidation. The tunnel contact junction (n+/p+) is just below the top oxide cladding and just above the current aperture.

A scanning electron microscope (SEM) image of the device cross section after oxidation is shown in FIG. 4. The arrows in FIG. 4 are slanted to show the direction of oxidation along the layers. The aperture layer oxidizes laterally from both outside edges forming a ~3.5 μm current aperture (see, for example, S. A. Maranowski, A. R. Sugg, E. I. Chen, and N. Holonyak, Jr., Appl. Phys. Lett. 63, 1660, 1993) just above the active region (WG+QW). The lower cladding oxidizes laterally from only one edge (right side in FIG. 4), while between the edges of the top $Si_3N_4$ defining stripes the $Al_{0.85}Ga_{0.15}As$ layer (146) oxidizes downward from the surface and slightly under the $Si_3N_4$ stripes and capping layer. This oxidation pattern provides an oxide-defined current aperture and the top and bottom oxide cladding and results in a device that depends upon lateral current for laser operation. Only lateral electron currents ($I_n$, FIGS. 2 and 3) in high mobility n-type layers are required for excitation. This includes the current driving the TJ that then supplies holes for the small amount of p-type crystal just above the active region. For the sake of comparison, other devices were fabricated similarly, but without the bottom oxide cladding so that only the behavior of the TJ with its lateral electron bias current could be addressed.

Fabrication of the oxide-defined lasers was completed by first removing the two $Si_3N_4$ stripes and then covering the capping layer and the space in between with photoresist. Next, 1500 Å of $SiO_2$ was electron-beam evaporated onto the crystal, and the $SiO_2$ above the photoresist was lifted off. This filled in the mesa on the shallow side (above the TJ) and prevents the device from being shorted out. The $Si_3N_4$ was removed and Ge/Au/Ni/Au was evaporated on the epitaxial side of the crystal over the mesas and shallower etched edge, and Ge/Au was evaporated on the substrate side. Both contacts (168, 162) were alloyed at 375° C. for 10 s. Diodes were cleaved from the wafer, diced and either probed for pulsed operation or mounted (epitaxial-layer side) on In-coated copper heat sinks for continuous (cw) operation.

Figure 5:
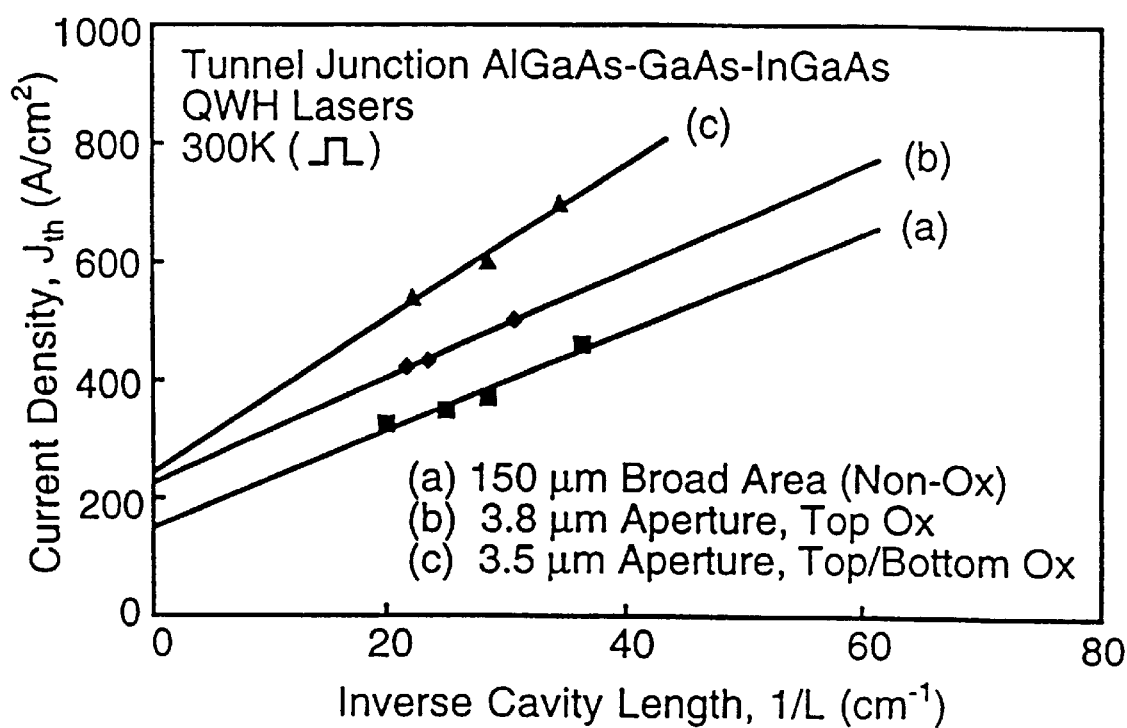
FIG. 5 shows current density at threshold ($J_{th}$) vs. inverse cavity length (1/L) for tunnel contact junction QWH lasers hereof: (a) broad area (width=150 μm) laser, (b) tunnel contact laser with top oxide cladding and 3.5 μm oxide-defined current aperture, and (c) tunnel contact laser with top and bottom oxide claddings and 3.8 μm oxide-defined current aperture.

FIG. 5 shows the QWH laser threshold current density $J_{th}$ vs. 1/L for three sets of devices under pulsed conditions at room temperature. All the devices were from the same crystal where (a) represents 150 μm wide broad area lasers (non-oxidized), (b) are oxide-aperture lasers (width=3.8 μm) with just the upper cladding oxidized, and (c) are oxide-aperture lasers with both claddings oxidized. The performance (low threshold) of the broad area lasers shows that the crystal was of good quality. By creating an oxide-defined current aperture and oxidizing the upper cladding layer (b), the threshold currents were increased by only ~100 A/cm² compared to (a). This indicates that the lateral electron current and TJ are effective in providing hole injection without the penalty of much additional series resistance, voltage drop, heating, or increase in threshold current. Also, by adding the lower oxide cladding, the threshold currents were increased further, but only by a relatively small amount.

Figure 6:
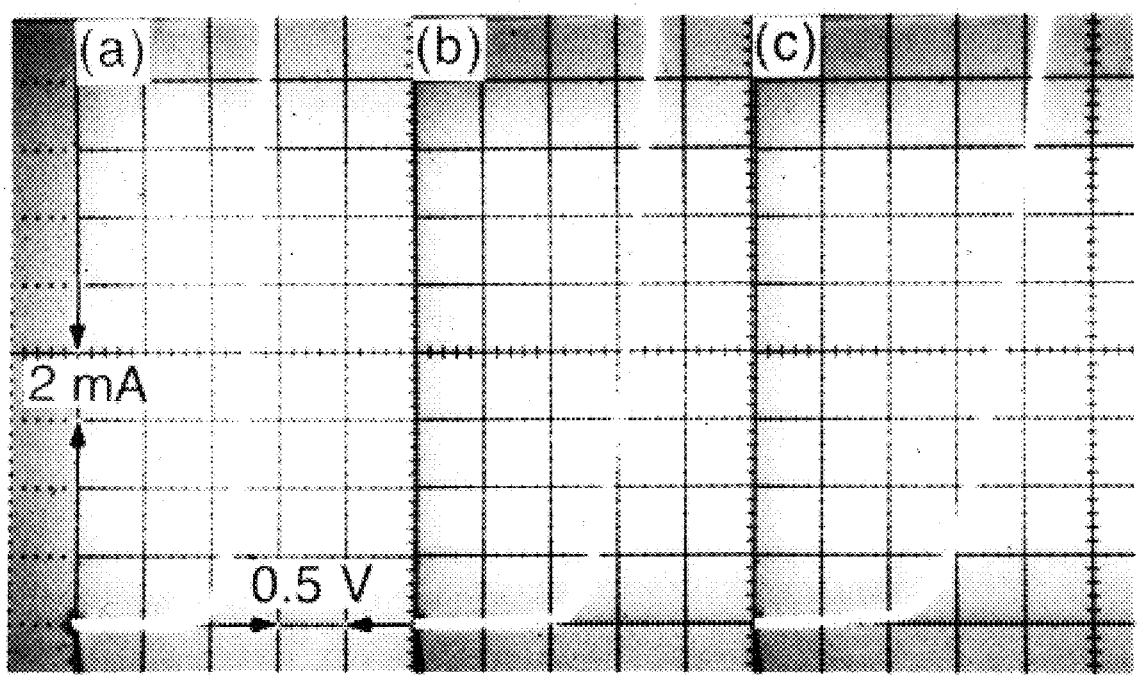
FIG. 6 shows current-voltage (I-V) characteristics of tunnel contact junction QWH lasers hereof: (a) broad area (150 μm) laser, (b) laser with top oxide cladding and 3.8 μm current aperture, and (c) laser with top and bottom oxide cladding and 3.5 μm current aperture. The series resistances of the three lasers increase from (a) $R_s$~10 ohm, to (b) ~15, to (c) only ~20.

To investigate the series resistance that is added to these devices by introducing oxide claddings and an oxide-defined current and thus forcing lateral bias currents, the current-voltage (I-V) characteristics of (a) a 150 μm broad area laser, (b) a QWH laser with oxide-defined aperture and top oxide cladding, and (c) the same as (b) but with top and bottom oxide claddings, were compared and the results shown in FIG. 6. The broad area laser (and no lateral current) turned on at 1.0 V and had a series resistance of $R_s$~10 Ω. The diode of (b) turned on slightly higher at 1.2 V and had a series resistance of only ~15 Ω (in spite of its smaller width), while (c) had about the same turn-on voltage and only a slightly larger series resistance of $R_s$~20 Ω. This showed that the lateral currents added only a small amount of series resistance and additional voltage drop, and that the TJ is efficient in lateral current operation (i.e., in effecting current spreading).

The diode whose I-V characteristic is shown in FIG. 6(c) operated cw with a threshold current of 10 mA (data not shown), and output power of 16 mW (without damaging the device). The total external differential quantum efficiency was $\eta_t$~59%, and the field was transverse electric (TE) polarized. The measured near field width at half-maximum was 3.4 μm (11 mA) which agreed with the aperture width. A lateral far-field pattern of this diode was single-lobed with a full angle at half-power of 21°, in the crystal plane and 42° in the vertical direction.

It is seen from the foregoing that by employing p+/n+ tunnel junctions (GaAs-InGaAs in these examples) to contact (internally) the p region of an AlGaAs-GaAs-InGaAs QWH laser, one can enclose a QWH laser with buried oxide layers and successfully introduce the excitation current laterally via high mobility n-layer electron conduction (not low mobility hole conduction). An achieved objective is the reduction of the p-type material of a QHW laser and the use of electron current as the lateral current, internally and at the terminals, to excite the device without the relatively large penalty in increased resistance that one would encounter in the p-type material of a conventional QWH laser diode. As seen, if the TJ is grown closer to the QW, absorption losses increase the threshold current, but to an acceptable extent.

Figure 7:
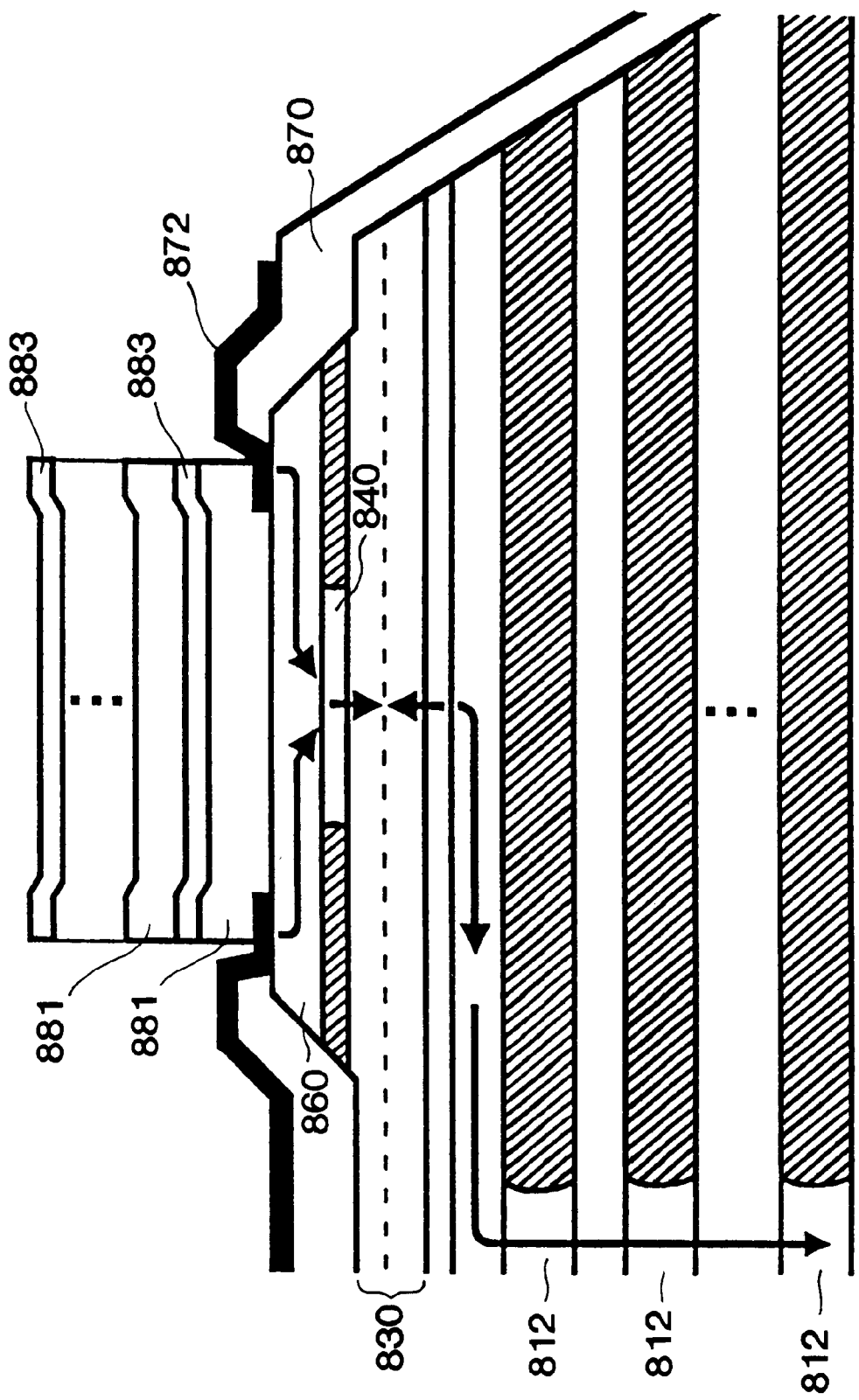
FIGS. 7 and 8 are cross-sectional diagrams (not to scale) of vertical cavity surface emitting laser (VCSEL) devices in accordance with an embodiment of the invention and made in accordance with a technique of the invention, with FIG. 8 being a more detailed diagram and FIG. 7 being simplified to facilitate understanding of operation.
Figure 8:
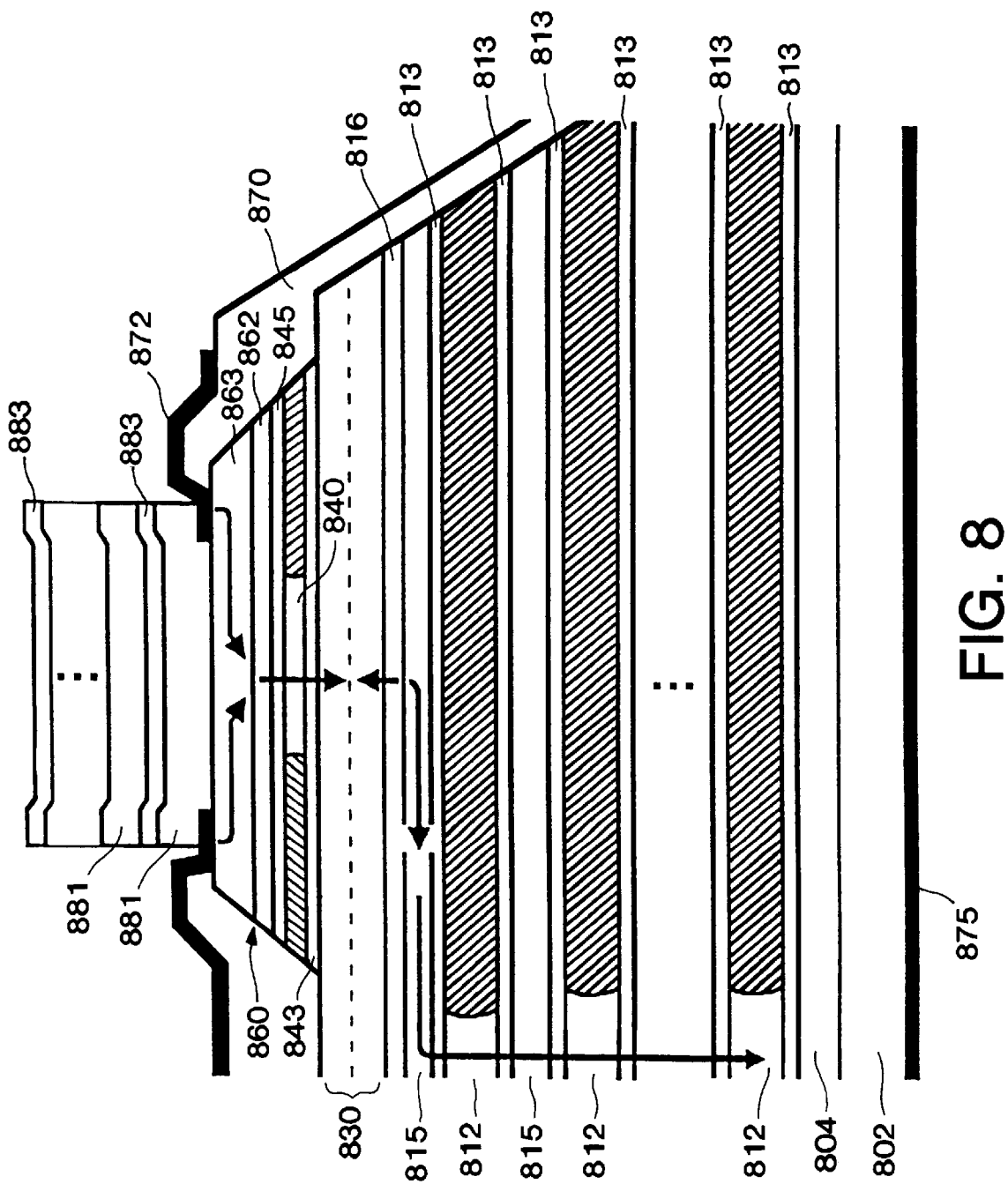

A vertical cavity surface emitting laser in accordance with an embodiment of the invention is shown in FIGS. 7 and 8, with FIG. 8 showing the greater detail and FIG. 7 being simplified to facilitate understanding of operation. As before, the crystals employed for exemplary devices were grown by metalorganic chemical vapor deposition (MOCVD) on n-type GaAs substrates (layer 802) and buffers (layer 804). The crystal growth began with a 6.5 period stack of n-type $Al_{0.98}Ga_{0.02}As$/GaAs (layers 812 and 815 respectively), each to be ~$\lambda$/4 thickness after oxidation (including buffer layers 813 of $Al_{0.75}Ga_{0.25}As$), followed by a $\lambda$/4 layer (816) of n-type $Al_{0.85}Ga_{0.15}As$. The n-type $\lambda$/4 thickness GaAs (uppermost layer 815) and $Al_{0.85}Ga_{0.15}As$ layer (816) are for the bottom-side lateral electron conduction. Next, an undoped $\lambda$ thickness cavity was grown. The active region cavity (830) was formed with two ~70 Å InGaAs quantum wells separated by ~50 Å of GaAs sandwiched between 500 Å of GaAs and 860 Å of $Al_{0.5}Ga_{0.5}As$ on each side. Then, a p-type $Al_{0.94}Ga_{0.06}As$ upper confining layer (840) was grown of $\lambda$/4 thickness, (with buffer layers 843 and 845 of p-type $Al_{0.75}Ga_{0.25}As$) that later was partially oxidized to form the current aperture. The structure described so far was capped with a $\lambda$/4 thickness $p^+/n^+$ GaAs tunnel contact junction 860 that allows lateral electron current to supply hole injection, via the p-type aperture, into the active region. The tunnel junction in this example included ~150 Å of p+ GaAs (layer 862), and ~550 Å of n+ GaAs (layer 863).

Figure 9:
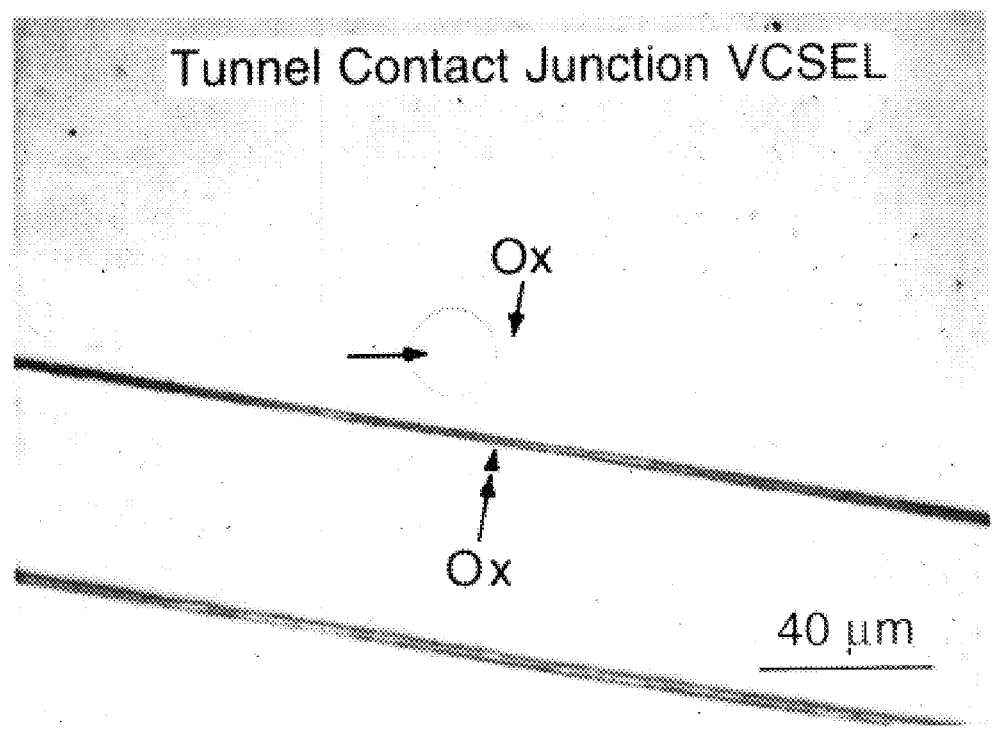
FIG. 9 is an optical microscope image (top-view) of a partially fabricated tunnel contact junction VCSEL hereof after oxidation. The aperture is formed by "wet" oxidation laterally ~5 μm from a ~20 μm-diameter disk edge creating a ~10 μm opening (unlabeled horizontal arrow). The DBR oxidizes laterally from the trench edge (double arrow) and proceeds ~22 μm (terminating at the single arrow), which oxidizes the DBR completely underneath the aperture.

Fabrication proceeded with photolithography and wet etching ($H_2SO_4$:$H_2O_2$:$H_2O$, 1:8:40) to form a ~46 $\mu$m wide trench exposing the bottom DBR for oxidation (double arrow, "Ox" in FIG. 9). A second photolithography process and a shallower wet etching step defined a ~20 $\mu$m diameter disk ~8 $\mu$m from the trench edge, exposing just the $Al_{0.94}Ga_{0.06}As$ aperture layer (840). The sample was then oxidized in an open tube furnace supplied with $H_2O$ vapor in a $N_2$ carrier gas for a total of 45 min at 430° C. (see, for example, J. M. Dallesasse, N. Holonyak, Jr., A. R. Sugg, T. A. Richard, and N. el-Zein, Appl. Phys. Lett. 57, 2844, 1990).

FIG. 9 is an optical microscope image (top-view) of the described tunnel contact junction VCSEL just after crystal oxidation. The aperture layer oxidizes laterally –5 $\mu$m from the edge of the –20 $\mu$m disk defining a current aperture of –10 $\mu$m diameter (unlabeled horizontal arrow in FIG. 9). The lower DBR oxidizes from the trench edge (double arrow) underneath the aperture for a total distance of ~22 $\mu$m. The upper arrow shows where the lower DBR oxidation ends. The oxidation defines the oxide-aperture and the $Al_xO_y$/GaAs lower DBR.

After the oxidation procedure the 20 $\mu$m diameter disks were covered with photoresist, and 1500 Å of $SiO_2$ was electron-beam evaporated onto the crystal. The photoresist was lifted off leaving a $SiO_2$ coating (870) to prevent shorting by subsequent metallizations. Ti/Au was evaporated for the top metal contact (872) with a ~12 $\mu$m diameter opening centered on the ~10 $\mu$m laser aperture. The crystal was then lapped and polished to 125 $\mu$m thickness. Ge/Au was evaporated on the substrate and was alloyed at 375° C. for 10 s to obtain contact 875. Then, five periods of $SiO_2$/Si (layers 881, 883, respectively), each layer of $\lambda$/4 thickness, were electron-beam evaporated for the upper DBR. Diodes were mounted oriented expitaxial-layer side upward on In-coated copper heat sinks for continuous (cw) laser operation at room temperature (300 K.).

The deposition of the upper DBR, with alternating layers 881 and 883 of $SiO_2$ and Si, completed the structure forming a compact high Q cavity in the vertical direction (normal to the substrate). Current flows into the substrate by wrapping around the lower $Al_xO_y$/GaAs DBR. From the top side of the VCSEL, lateral electron currents drive the tunnel contact junction (TJ n+/p+), which in turn supplies holes ($h^+$) to forward bias the small amount of p-type crystal at and above the active region. The tunnel contact junction eliminates the need for lateral hole conduction, and the amount of p-type material and hole conduction are minimized. All lateral conduction involves electron currents to thus lower device resistance, voltage drop, and heating.

Figure 10:
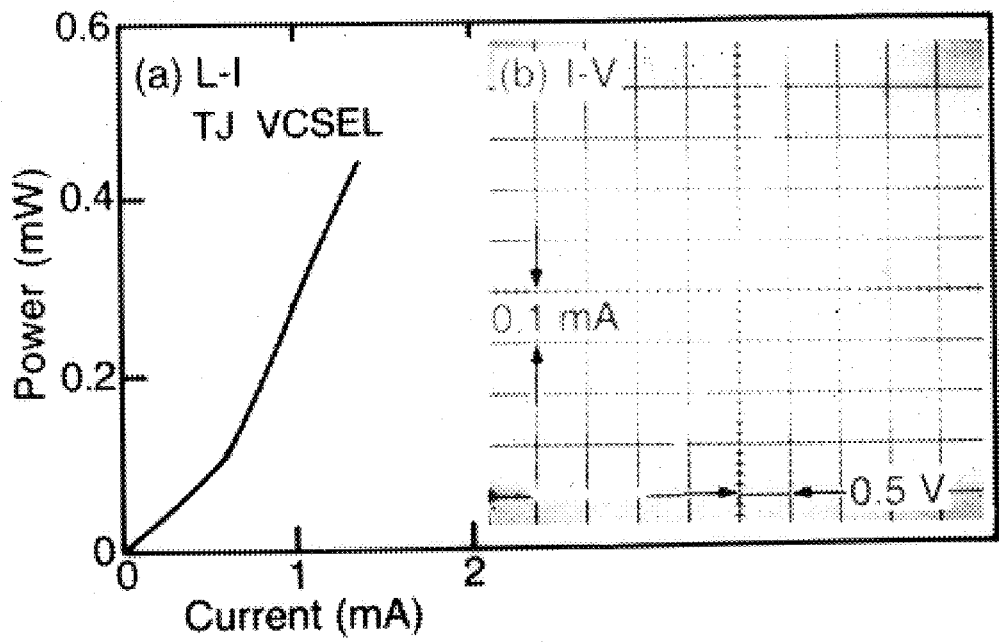
FIG. 10 shows the (a) light vs. current (L-I) and (b) current vs. voltage (I-V) characteristics for the tunnel contact junction VCSEL of FIGS. 7–9. The lasing threshold is ~0.55 mA and the external differential quantum efficiency ~35%. The diode turns on at ~1V.

FIG. 10 shows (a) the light vs. current (L-I) behavior and (b) the current vs. voltage (I-V) characteristic for the described tunnel contact junction VCSEL. All measurements were at room temperature under cw conditions. The L-I curve has a steep slope (see P. W. Evans, N. Holonyak, Jr., S. A. Maranowski, M. J. Ries, and E. I. Chen, Appl. Phys. Lett. 67, 3168, 1995) before threshold that is characteristic of amplified spontaneous emission (ASE). The threshold current was ~0.55 mA ($J_{th}$~700 A/$cm^2$) and the emission wavelength was ~986 nm. The external differential quantum efficiency was ~35% while the total power efficiency (wall plug) was ~12% at 1 mA. The diode turned on sharply at ~1 V. The tunnel junction contact of the device was not optimized since other comparison diodes fabricated from similarly designed crystals exhibited sharper I-V characteristics with series resistances of ~100 $\Omega$, but did not lase because of detuned cavities. This shows that a VCSEL can operate with a tunnel contact junction that provides holes via lateral electron current without excessive voltage drop.

Figure 11:
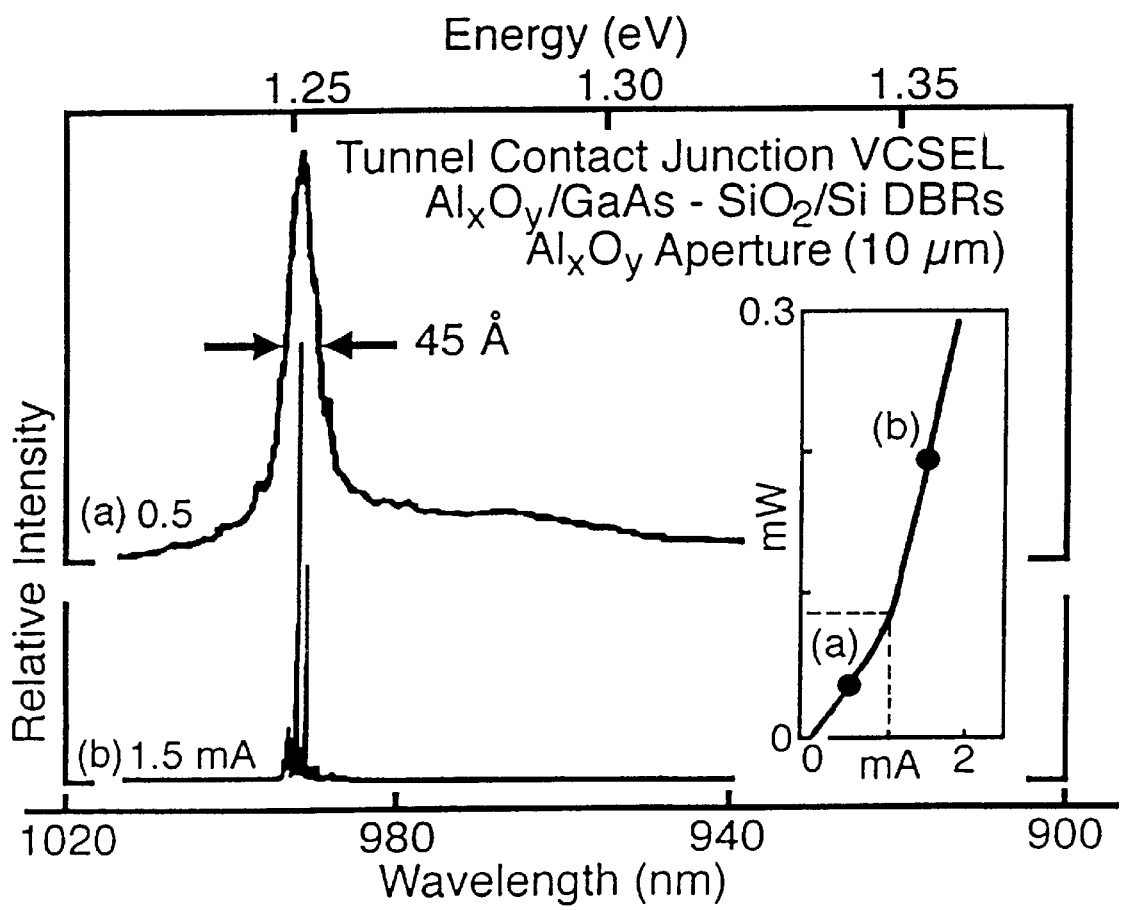
FIG. 11 shows the light vs. current characteristics (inset) for a tunnel contact junction VCSEL (as in FIGS. 7–9). The spectrum is narrow (45 Å, 0.5 mA) due to amplified spontaneous emission, with current threshold at 1 mA. Laser operation is centered at the wavelength 990 nm.

FIG. 11 shows the spectra and L-I curve (inset) for a further tunnel contact junction VCSEL fabricated in a similar manner. This device also had a region of amplified spontaneous emission (ASE) and steep L-I slope before threshold at 1 mA. The spectra show that the ASE is narrow (45 Å) and that some ringing occurs, possibly due to lateral disk modes (see H. Deng. Q. Deng, and D. G. Deppe, Appl. Phys. Lett. 69, 3120, 1996). At 1.5 mA the spectra were narrow ~1 Å and centered at 990 nm. This wavelength difference compared to the diode of FIG. 10 may be related to the higher threshold (slight de-tuning), and lower (~17%) external differential quantum efficiency. This further device had a maximum power output of 0.55 mW.

The tunnel contact junction allows for the reduction of p-type material in the VCSEL structure and provides hole injection into the active region via lateral electron currents. It will be understood that tunnel junctions can be used not only in the previously described hybrid VCSELs and edge emitters with native-oxide-based layers but also, for example, in other forms of VCSELs, edge-emitting lasers, and light emitting diodes that require lateral currents for excitation or reduction of p-type material.

Figure 12:
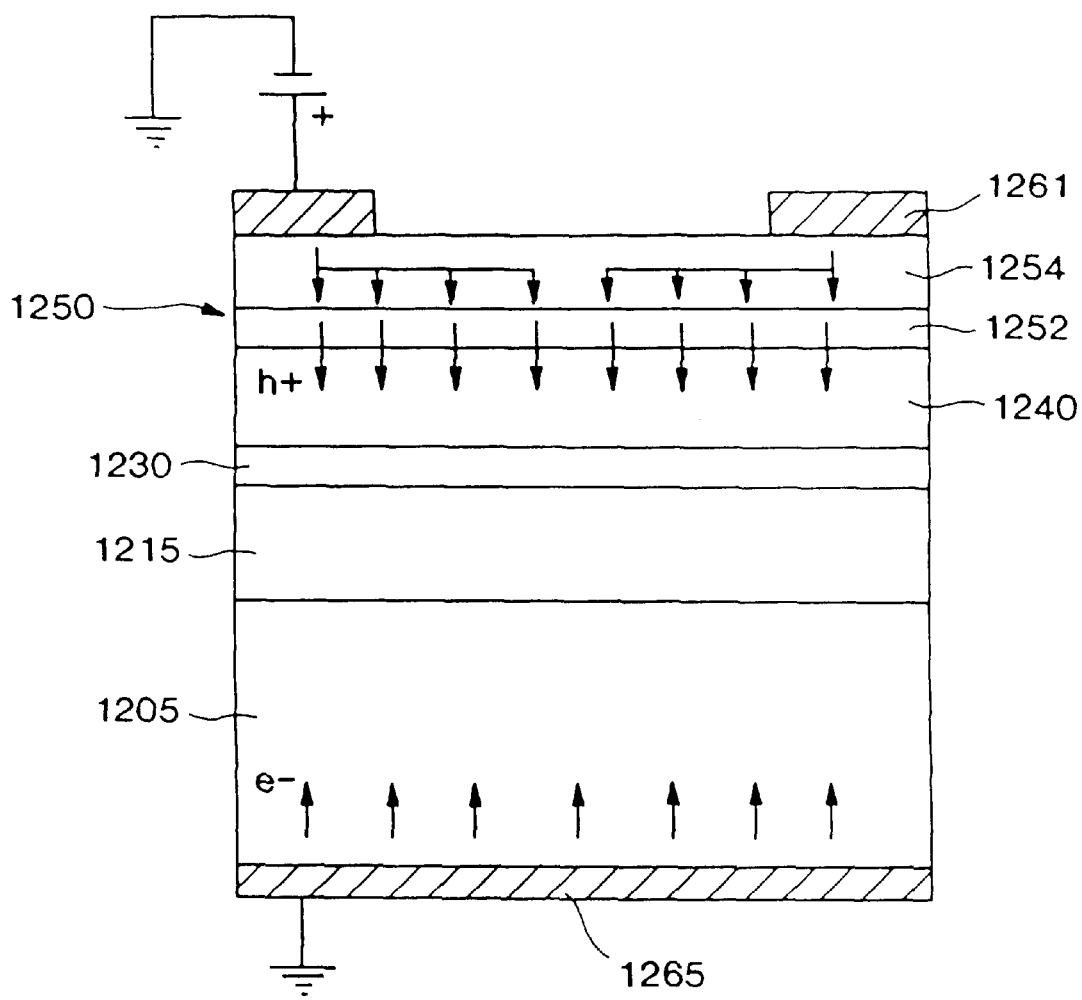
FIG. 12 is a cross-sectional diagram (not to scale) of a light-emitting diode in accordance with an embodiment of the invention and which can be made in accordance with a technique of the invention.

Referring to FIG. 12, there is shown a light emitting diode (LED) in accordance with an embodiment of the invention. An n-type substrate 1205 has an n-type confining layer 1215 disposed thereon. The substrate 1205 may be, for example, GaAs or GaP, and the lower confining layer 1215 may be, for example, n-type AlGaAs. It will be understood herein, and elsewhere, that additional layers, for example buffer layers may be present. An active region is represented at 1230, and, as elsewhere, will be selected to obtain the desired light wavelength. As one example, the active region may be bulk AlGaInP or may include one or more quantum wells of GaAs or InGaP between layers of AlGaInP. An upper confining layer 1240 is a p-type layer, for example a layer of p-type AlGaAs or AlInP. Above the p-type upper confining layer 1240 is the p+ layer 1252 and an n+ layer 1254. Here, as elsewhere, both of these layers may be heavily doped GaAs or, for example, the n+ portion may include two n+ layers, such as a layer of n+ InGaAs with n+ GaAs thereon.

Figure 13:
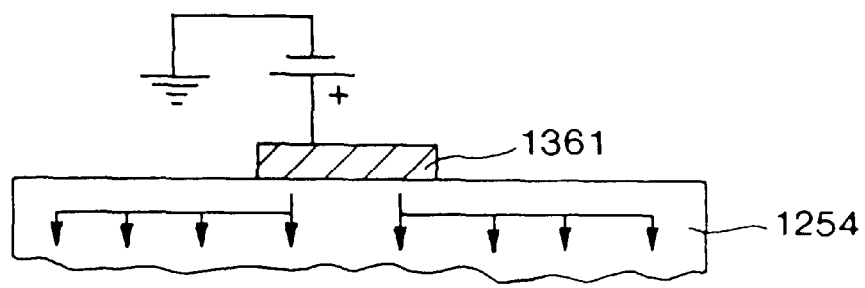
FIG. 13 shows an example of a variation of the FIG. 12 device.

The tunnel junction is labelled at 1250. Metal contacts 1261 and 1265, which may be, for example Ti/Au or Ge/Au, are respectively applied to the top and bottom of the light emitting diode. A positive potential can be applied via the contacts, as shown. In the embodiment FIG. 12, the top electrode is a ring electrode, and a substantial portion of the top of the device, inside the ring, is an aperture through which the generated light can be emitted. Alternative electrode configurations can be used, for example as shown in FIG. 13 wherein a central (e.g. circular) contact 1361 is used, and the light from the LED is emitted outside the region of the electrode. In either case, there will be lateral current flow as current travels from the contact(s) and eventually into an active region having greater area (in the plane of the layers) than the area the contact(s) cover. In prior art devices, where this traversal is through p-type material, it is generally necessary to have the p-type material be of sufficient thickness to carry the lateral current without undue loss, since the p-type material has relatively lower mobility hole conduction. As previously set forth, an advantageous feature of the present invention is that the p-type layer can be made substantially thinner (with attendant reduction in electrical and optical losses), and n-type semiconductor material can be used to carry electron current in more efficient manner, and laterally where necessary, with the tunnel junction operating to convert electron current to hole current.

We claim:

1. A semiconductor light emitting device, comprising:
    a semiconductor active region disposed between first and second semiconductor layers, said first semiconductor layer being p-type, and said second semiconductor layer being n-type;
    tunnel junction means disposed over said first semiconductor layer;
    means for coupling electric potential between said tunnel junction means and said second semiconductor layer; and
    means for causing lateral electron flow into said tunnel junction means.

2. The device as defined by claim 1, wherein said tunnel junction means comprises an n+/p+ junction oriented with the p+ portion thereof adjacent said first semiconductor layer.

3. The device as defined by claim 2, wherein said at least part of said lateral electron flow is in the n+ portion of said tunnel junction means.

4. The device as defined by claim 2, wherein said means for coupling an electrical potential comprises means for coupling a positive potential to said tunnel junction means with respect to said second semiconductor layer so that the tunnel junction is reverse biased.

5. The device as defined by claim 3, wherein said means for coupling an electrical potential comprises means for coupling a positive potential to said tunnel junction means with respect to said second semiconductor layer so that said tunnel junction is reverse biased.

6. The device as defined by claim 1, wherein said semiconductor layers, said semiconductor active region, and said tunnel junction means are III-V semiconductor materials.

7. The device as defined by claim 1, wherein said device is a semiconductor laser device.

8. The device as defined by claim 1, wherein said device is a vertical cavity surface emitting laser.

9. The device as defined by claim 1, wherein said device is a light emitting diode.

10. For use in a generally planar semiconductor device wherein a layer of p-type semiconductor material is disposed over a layer of n-type semiconductor material, and an electric potential is coupled between said p-type layer and said n-type layer, and wherein current in said device that is lateral to the plane of said layers is coupled into said p-type layer, the improvement comprising: a tunnel junction adjacent said p-type layer for converting said lateral current into hole current.

11. The device as defined by claim 10, wherein said tunnel junction comprises an n+/p+ junction oriented with the p+ portion thereof adjacent said p+ layer.

12. The device as defined by claim 11, wherein said at least part of said lateral electron flow is in the n+ portion of said tunnel junction.

13. The device as defined by claim 10, wherein said semiconductor layers, and said tunnel junction are III-V semiconductor materials.

14. A semiconductor carrier conversion planar structure for producing hole carriers in a planar p-type semiconductor layer of a semiconductor device, comprising:
    an n-type semiconductor layer disposed over said p-type semiconductor layer;
    tunnel contact junction means disposed between said n-type semiconductor layer and said p-type semiconductor layer; and
    means for applying a positive electric potential to said n-type semiconductor layer with respect to said p-type semiconductor layer in a manner such that a lateral component of electron current flows in said n-type layer, and whereby electron carriers in said n-type semiconductor layer are converted into hole carriers in said p-type semiconductor layer.

15. The structure as defined by claim 14, wherein said tunnel junction means comprises a p+ layer and wherein at least a portion of said n-type semiconductor layer adjacent said p+ layer is n+ semiconductor material.

16. The structure as defined by claim 14, wherein said tunnel junction means comprises a p+ semiconductor layer and an n+ semiconductor layer, said p+ semiconductor layer being adjacent said p-type semiconductor layer and said n+ semiconductor layer being adjacent said n-type semiconductor layer.

17. The structure as defined by claim 14, wherein said semiconductor layers and said tunnel contact junction means are III-V semiconductor materials.

18. A semiconductor light emitting device, comprising:
    an n-type semiconductor substrate;
    a first layer of semiconductor material disposed over said substrate, said first layer being n-type semiconductor;
    a semiconductor active region disposed over said first layer;
    a second layer of semiconductor material disposed over said active region, said second layer being p-type semiconductor;
    tunnel junction means disposed over said second layer; and
    means for coupling an electric potential between said tunnel junction means and said substrate.

19. For use in the fabrication of a generally planar light emitting semiconductor device which includes: a semiconductor active region disposed between first and second semiconductor layers, said first semiconductor layer being p-type, and said second semiconductor layer being n-type; and means for coupling an electric potential between said p-type layer and said n-type layer; and wherein current in said device that is lateral to the plane of said layers is coupled into said p-type layer; a method comprising providing a tunnel junction adjacent said p-type layer for converting said lateral current into hole current and coupling said hole current into said p-type layer.

20. A semiconductor laser device, comprising:
- a semiconductor active region disposed between first and second semiconductor layers, said first semiconductor layer being p-type, and said second semiconductor layer being n-type;
- an aperture layer disposed over said first semiconductor layer, said aperture layer having an aperture through which current can pass;
- tunnel junction means disposed over said first semiconductor layer;
- means for coupling electric potential between said tunnel junction means and said second semiconductor layer, said coupling means including a conductive contact disposed over said tunnel junction means and being transversely displaced from said aperture, so that current flows laterally in said device from said contact to said aperture; and
- reflective means forming an optically resonant partially reflective cavity for light emitted from said active region.

21. The device as defined by claim 20, wherein said tunnel junction means comprises an n+/p+ junction oriented with the p+ portion thereof adjacent said first semiconductor layer.

22. The device as defined by claim 21, wherein said at least part of said lateral electron flow is in the n+ portion of said tunnel junction means.

23. The device as defined by claim 20, wherein said means for coupling an electrical potential further comprises means for coupling a positive potential to said tunnel junction means with respect to said second semiconductor layer so that the tunnel junction is reverse biased.

24. The device as defined by claim 20, wherein said semiconductor layers, said semiconductor active region, and said tunnel junction means are III-V semiconductor materials.

25. The device as defined by claim 22, wherein said aperture contains p-type material.

26. The device as defined by claim 25, wherein said aperture layer is disposed between said tunnel junction and said active region.

27. The device as defined by claim 20, wherein said device is a vertical cavity surface emitting laser.

* * * * *